(12) United States Patent
Nishida et al.

(10) Patent No.: US 8,173,895 B2
(45) Date of Patent: May 8, 2012

(54) SOLAR CELL

(75) Inventors: Takahiko Nishida, Tokyo (JP);
Mitsunori Nakatani, Tokyo (JP);
Hiroaki Morikawa, Tokyo (JP); Shoichi Karakida, Tokyo (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 0 days.

(21) Appl. No.: 12/756,388

(22) Filed: Apr. 8, 2010

(65) Prior Publication Data

US 2010/0193028 A1  Aug. 5, 2010

Related U.S. Application Data

(62) Division of application No. 11/547,656, filed as application No. PCT/JP2005/021782 on Nov. 28, 2005.

(51) Int. Cl.
*H01L 31/00* (2006.01)

(52) U.S. Cl. ........................... 136/256; 136/252

(58) Field of Classification Search .................. 136/243, 136/256, 252
See application file for complete search history.

(56) References Cited

U.S. PATENT DOCUMENTS

| | | | |
|---|---|---|---|
| 4,127,424 A | 11/1978 | Ullery, Jr. | |
| 4,320,251 A * | 3/1982 | Narasimhan et al. | ......... 136/256 |
| 5,279,682 A | 1/1994 | Wald et al. | |
| 6,069,065 A | 5/2000 | Arimoto | |
| 2002/0005583 A1* | 1/2002 | Harada et al. | ................. 257/758 |
| 2004/0027787 A1 | 2/2004 | Yamauchi et al. | |
| 2008/0105297 A1* | 5/2008 | Nishida et al. | ................. 136/256 |

FOREIGN PATENT DOCUMENTS

| | | |
|---|---|---|
| CN | 1471114 A | 1/2004 |
| EP | 1271662 A1 | 1/2003 |
| JP | 10-144943 | 5/1998 |
| JP | 10-335267 | 12/1998 |
| JP | 2002-217435 | 8/2002 |
| JP | 2002-289634 A | 10/2002 |
| JP | 2003-273378 | 9/2003 |
| JP | 2003-273379 | 9/2003 |
| WO | WO 92/22928 | 2/1992 |
| WO | WO 93/24961 | 12/1993 |

OTHER PUBLICATIONS

Extended European Search Report dated Aug. 16, 2010 issued in corresponding European Application No. 05809633.0 0 2203.
CN Office Action issued Apr. 13, 2011 in a corresponding Chinese patent application.

* cited by examiner

*Primary Examiner* — Basia Ridley
*Assistant Examiner* — Lindsey Bernier
(74) *Attorney, Agent, or Firm* — Buchanan Ingersoll & Rooney PC

(57) ABSTRACT

A solar cell includes a photoelectric conversion layer, a first electrode on one surface of the photoelectric conversion layer, a second electrode provided on other surface of the photoelectric conversion layer, and a third electrode on the other surface of the photoelectric conversion layer. The third electrode is substantially rectangular with its corners rounded off in the in-plane direction of the photoelectric conversion layer, and overlaps the second electrode at the periphery thereof.

4 Claims, 11 Drawing Sheets

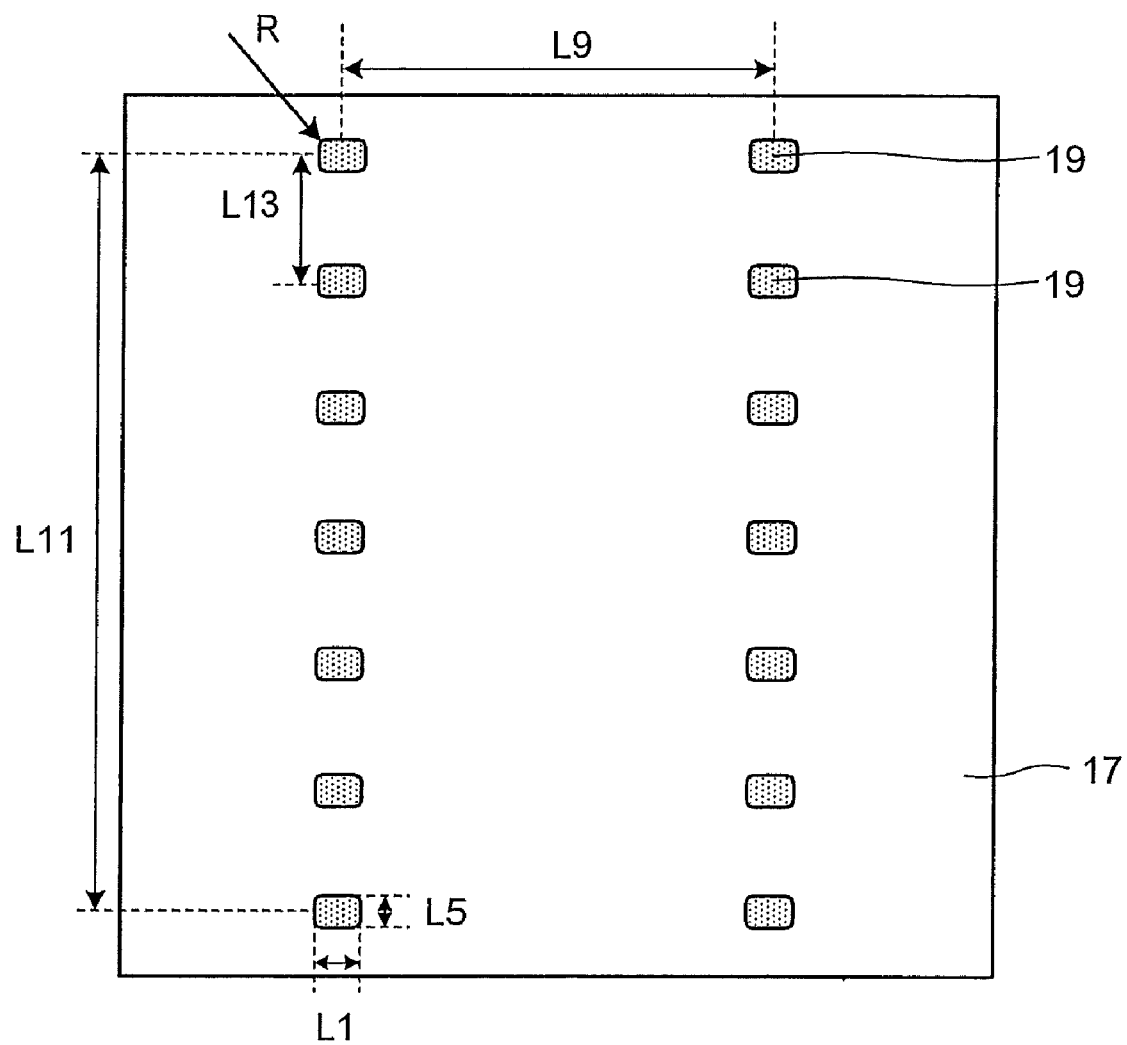

SOLAR CELL

CROSS-REFERENCE TO RELATED APPLICATIONS

This application is a divisional of, and claims priority under 35 U.S.C. §120 to U.S. patent application Ser. No. 11/547,656 filed on Oct. 5, 2006, currently pending, which was the National Stage filing under 35 U.S.C. §371 of International Application No. PCT/JP2005/021782 filed on Nov. 28, 2005. The entire contents of each of these applications are hereby incorporated by reference in this application.

TECHNICAL FIELD

The present invention relates to a solar cell, and more specifically relates to a solar cell on which separation of electrodes is prevented.

BACKGROUND ART

Photovoltaic power generation is a clean method of generating electric power using inexhaustible light energy without discharging toxic substances. A solar cell is used for the photovoltaic power generation, which is a photoelectric converter that generates electric power by converting light energy from the sun into electric energy.

Conventionally, an electrode on the back of a light receiving surface of a generally produced solar cell is formed by screen-printing silver paste and aluminum paste on the back surface of a silicon substrate, then drying and firing the pastes. The aluminum formed substantially all over the back surface of the silicon substrate serves as a positive electrode. However, in the process of producing a solar cell module, a lead tab for extracting electric power cannot be soldered directly to the aluminum electrode formed of aluminum. Therefore, a silver electrode is formed, as an electrode for extracting electric power, in such a manner as to partially overlap the aluminum electrode on the back surface of the silicon substrate (see Patent Documents 1 and 2).

As just described, on the back surface of the substrate of the solar cell, an aluminum electrode for higher electric power output and a silver electrode for extracting the electric power are partially overlapped. In the area where the aluminum electrode and the silver electrode are overlapped, three metals of silicon in the silicon substrate, aluminum in the aluminum electrode, and silver in the silver electrode are partially alloyed.

Patent Document 1: Japanese Patent Publication No. 2003-273378
Patent Document 2: Japanese Patent Publication No. HEI 10-335267

DISCLOSURE OF INVENTION

Problem to be Solved by the Invention

However, the overlapped area is very fragile due to stress assumedly caused by different rate of thermal expansion of each material that occurs during rapid heating and cooling in firing. Therefore, after the firing, for example, when the silver electrode is present on the aluminum electrode, the silver electrode can separate from the aluminum electrode at a corner of the overlapped area.

To reduce the cost of the solar cell, it is necessary to make the silicon substrate thinner, which occupies a high rate of the material cost. However, if the thickness of the silicon substrate is simply reduced, the warpage of the silicon substrate caused by different rates of thermal shrinkage between silicon and aluminum is larger compared with a thicker silicon substrate.

When the silicon substrate warps to a large extent, there is a problem that the silicon substrate cracks in production process after the firing, resulting in a low production yield, or the production becomes impossible due to the crack in the silicon substrate.

One approach to the problem could be to prevent the silicon substrate from warping by, for example, reviewing materials of the aluminum paste to improve the rate of thermal shrinkage of the electrode material. However, if the materials of the aluminum paste are simply modified, there is still a risk of the silver electrode partially separating due to the different rates of thermal shrinkage between aluminum and silver depending on the materials combination.

In this case, when the silver electrode separates to a large extent, there is also a problem that the solar cell cracks due to stacking of solar cells or the characteristics of the solar cell deteriorate, and thus the production yield decreases.

The present invention was made in view of the problems described above, and it is an object of the present invention to provide a solar cell on which the separation of electrodes is effectively prevented.

Means for Solving Problem

To solve the problems described above and achieve the object, the solar cell according to an aspect of the present invention includes a photoelectric conversion layer; a first electrode provided on one surface of the photoelectric conversion layer; a second electrode provided on other surface of the photoelectric conversion layer; and a third electrode for extracting electric power from the second electrode, in which the third electrode is provided on the other surface with periphery thereof overlapping above the second electrode, and is substantially square with substantially round corners.

Effect of the Invention

As described above, the solar cell according to an aspect of the present invention includes a photoelectric conversion layer, a first electrode formed on one side of the photoelectric conversion layer, a second electrode formed on the other side of the photoelectric conversion layer, and a third electrode to extract electric power from the second electrode. The third electrode is substantially square with corners rounded off, and overlaps the second electrode at the periphery. Thus, the third electrode can be reliably bonded with the second electrode even at the corners thereof, whereby a solar cell on which the separation of the third electrode is effectively prevented is realized.

Further, the electrodes are strongly adhered to the substrate, and there is not a fragile area subjected to concentrated stress, which reduces possibilities that the substrate can wrap or crack. Therefore, the solar cell according to an aspect of the present invention does not cause many cracks on the silicon substrate differently from the conventional one even when the thickness of the silicon substrate is reduced to lower the cost of the solar cell, and is applicable enough, whereby the usable materials can be selected from wider options.

Because the solar cell according to an aspect of the present invention has the third electrode rounded off at the corners, the area of the third electrode is smaller, and the amount of the material used for the electrode can be reduced. This reduces the material cost, and thus realizes an inexpensive solar cell.

BRIEF DESCRIPTION OF DRAWINGS

FIG. 1-2 is a plan view for explaining a general configuration of a front surface (a light receiving surface) of the solar cell according to the first embodiment of the present invention;

FIG. 1-3 is a plan view for explaining a general configuration of a back surface (a surface opposite to the light receiving surface) of the solar cell according to the first embodiment of the present invention;

FIG. 1-4 is an enlarged schematic of an alloyed area where three metals of silicon, aluminum, and silver are partially alloyed on the solar cell according to the first embodiment of the present invention;

FIG. 1-5 is an enlarged cross section of a surrounding area of a region B and a region C, where an aluminum electrode and a back-surface silver electrode are partially overlapped on the back surface of the solar cell according to the first embodiment of the present invention;

FIG. 2 is an enlarged cross section of a surrounding area of a region B' and a region C', where the aluminum electrode and the back-surface silver electrode are partially overlapped on the back surface of a conventional solar batter cell;

FIG. 3-1 is a cross section for explaining a method for producing the solar cell according to the first embodiment of the present invention;

FIG. 3-2 is a cross section for explaining the method for producing the solar cell according to the first embodiment of the present invention;

FIG. 3-3 is a cross section for explaining the method for producing the solar cell according to the first embodiment of the present invention;

FIG. 3-4 is a cross section for explaining the method for producing the solar cell according to the first embodiment of the present invention;

FIG. 3-5 is a cross section for explaining the method for producing the solar cell according to the first embodiment of the present invention;

FIG. 3-6 is a cross section for explaining the method for producing the solar cell according to the first embodiment of the present invention;

FIG. 3-7 is a plan view for explaining an example of a screen mask used for printing with a silver paste in the production of the solar cell according to the first embodiment of the present invention;

FIG. 3-8 is a cross section for explaining an example of a screen mask used for printing with a silver paste in the production of the solar cell according to the first embodiment of the present invention;

FIG. 3-9 is a cross section for explaining the method for producing the solar cell according to the first embodiment of the present invention;

FIG. 3-10 is a cross section for explaining the method for producing the solar cell according to the first embodiment of the present invention;

FIG. 4-1 is a plan view for explaining dimensions on the back surface (a surface opposite to the light receiving surface) of an actual solar cell that adopts the first embodiment of the present invention;

FIG. 4-2 is a plan view for explaining a shape and dimensions of a back-side silver electrode on the actual solar cell that adopts the first embodiment of the present invention;

FIG. 5-1 is a plan view for explaining a general configuration of the back surface (a surface opposite to the light receiving surface) of a solar cell according to a second embodiment of the present invention;

FIG. 5-2 is an enlarged schematic of an alloyed area where three metals of silicon, aluminum, and silver are partially alloyed on the solar cell according to the second embodiment of the present invention;

FIG. 5-3 is an enlarged cross section of a surrounding area of a region D and a region E, where an aluminum electrode and a back-surface silver electrode are partially overlapped on the back surface of the solar cell according to the second embodiment of the present invention;

FIG. 6-1 is a plan view for explaining dimensions on the back surface (a surface opposite to the light receiving surface) of an actual solar cell that adopts the second embodiment of the present invention; and FIG. 6-2 is a plan view for explaining a shape and dimensions of a back-side silver electrode on the actual solar cell that adopts the second embodiment of the present invention.

| EXPLANATIONS OF LETTERS OR NUMERALS | |
|---|---|
| 10 | Semiconductor layer |
| 11 | Silicon substrate |
| 13 | n-type diffused layer |
| 13a | n-type diffused layer |
| 14 | p+ layer |
| 15 | Antireflective coating |
| 17 | Aluminum electrode |
| 17a | Aluminum paste layer |
| 19 | Back-surface silver electrode |
| 19a | Silver paste layer |
| 21 | Front-surface silver electrode |
| 21a | Silver paste layer |
| 23 | Alloyed area |
| 25 | Mesh |
| 27 | Emulsion |
| 31 | Back-surface silver electrode |
| 33 | Alloyed area |

BEST MODE(S) FOR CARRYING OUT THE INVENTION

Exemplary embodiments of a solar cell according to the present invention are explained below in detail while referring to the accompanying drawings. It should be noted that the present invention is not limited by the following description, but can be changed in various manners within the scope of the present invention. In the accompanying drawings, scale sizes may vary among the drawings and among members depicted therein for better understanding.

First Embodiment

Figure 1:
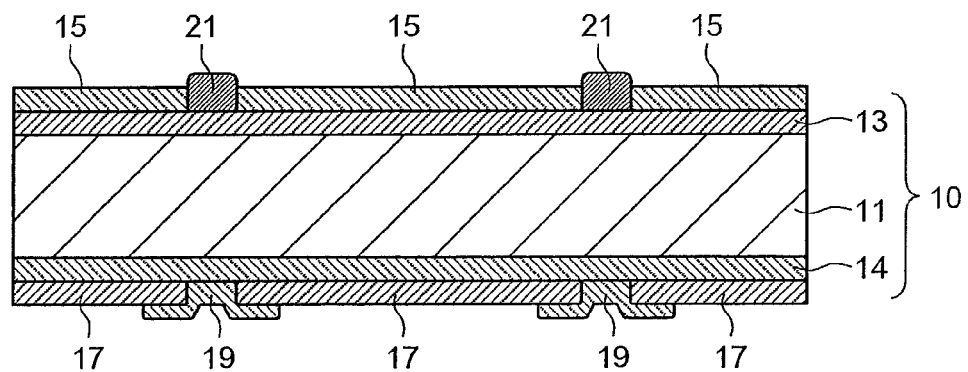
FIG. 1-1 is a cross section for explaining a general configuration of a solar cell according to a first embodiment of the present invention.
Figures 1, 2:
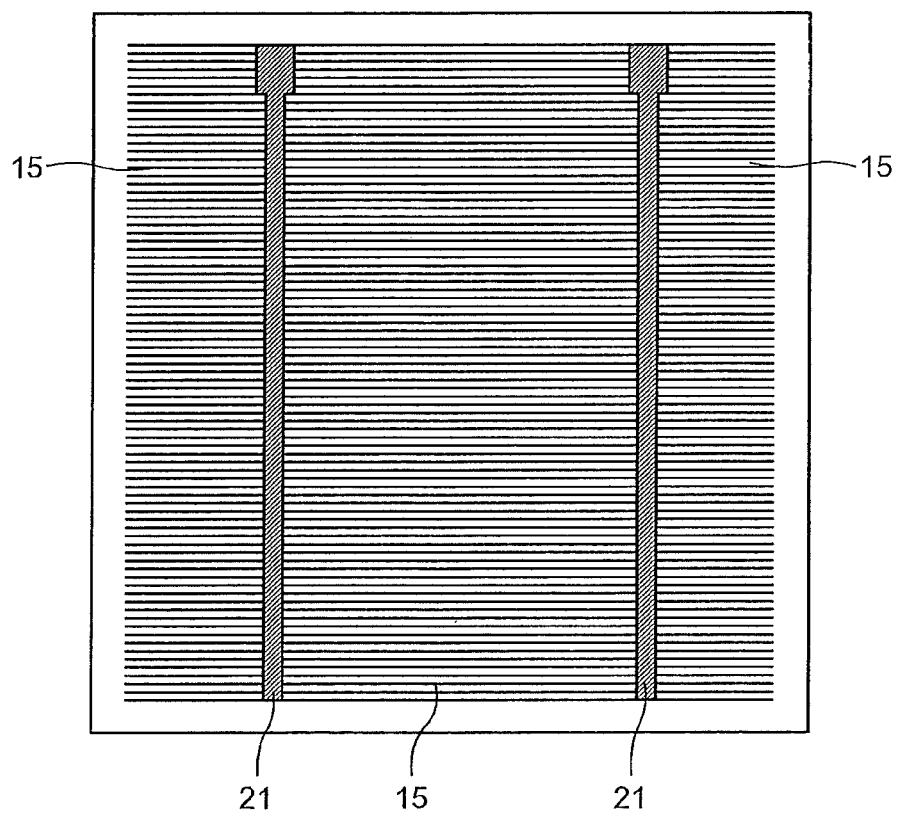
Figures 1, 2, 3:
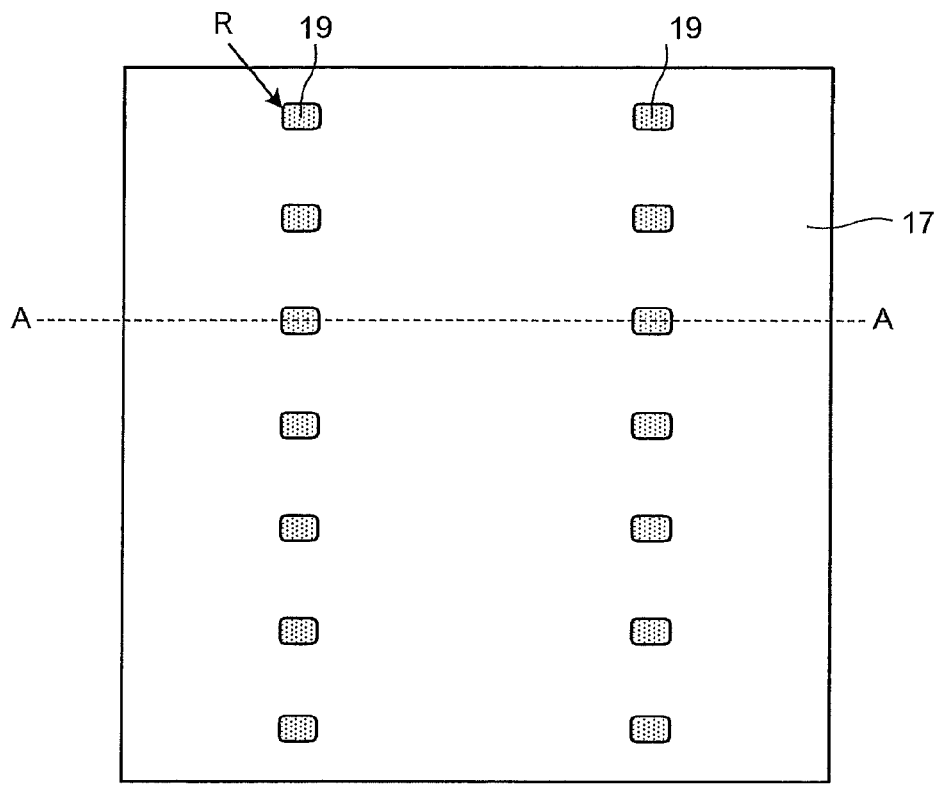

FIGS. 1-1 to 1-3 are drawings for explaining a solar cell according to a first embodiment of the present invention, and FIG. 1-1 is a cross section for explaining a general configuration of the solar cell according to the first embodiment. FIG. 1-2 is a plan view for explaining a general configuration of a front surface (a light receiving surface) of the solar cell according to the first embodiment, and FIG. 1-3 is a plan view for explaining a general configuration of a back surface (a surface opposite to the light receiving surface) of the solar cell according to the first embodiment. Incidentally, FIG. 1-1 is a cross section taken along the line A-A of FIG. 1-3.

The solar cell according to the embodiment includes, as shown in FIGS. 1-1 to 1-3, a semiconductor layer 10 that is a photoelectric conversion layer including a p-type layer 11 that is a p-type silicon substrate as a semiconductor substrate, an n-type diffused layer 13 with a conductivity type inverse to that of the surface of the p-type layer 11, and a p+ layer (back surface field (BSF) layer) 14 containing a high concentration of impurity; an antireflective coating 15 provided on a light receiving surface of the semiconductor layer 10 to prevent the reflection of incident light; a front-surface silver electrode 21 that is a light receiving surface electrode provided on the light receiving surface of the semiconductor layer 10 substantially in the shape of a stick; an aluminum electrode 17 that is a back-surface electrode provided substantially all over the back surface of the semiconductor layer 10 to extract electric power and reflect the incident light; and a back-surface silver electrode 19 that is an extracting electrode that extracts the electric power from the aluminum electrode 17.

In the solar cell according to the embodiment configured as above, when sunlight irradiates the side of the light receiving surface (the side of the antireflective coating 15) of the solar cell and reaches a p-n junction surface (a junction surface of the p-type layer 11 and the n-type diffused layer 13) inside, a hole and electron pair on the p-n junction surface is separated. The separated electron moves toward the n-type diffused layer 13. On the other hand, the separated hole moves toward the p+ layer 14. This produces an electrical potential difference between the n-type diffused layer 13 and the p+ layer 14 so that the p+ layer 14 has a higher potential. This makes the front-surface silver electrode 21 connected to the n-type diffused layer 13 a positive electrode and the aluminum electrode 17 connected to the n-type diffused layer 13 a negative electrode so that the electricity flows through an external circuit (not shown).

Next, features of the solar cell according to the embodiment are explained. As shown in FIGS. 1-3 and 1-4, in the solar cell according to the embodiment, the aluminum electrode 17 and the back-surface silver electrode 19 are partially overlapped on the p+ layer 14. FIG. 1-4 is a schematic that depicts an enlargement of an area surrounding the back-surface silver electrode 19 shown in FIG. 1-3, i.e., a schematic that depicts an enlargement of the partially overlapped area of the aluminum electrode 17 and the back-surface silver electrode 19 provided on the back surface of the solar cell. FIG. 1-5 is a schematic that depicts an enlargement of the area surrounding the back-surface silver electrode 19 shown in the cross section in FIG. 1-1, i.e., a cross section of the surrounding area of a region B and a region C, where the aluminum electrode 17 and the back-surface silver electrode 19 are partially overlapped on the back surface of the solar cell.

In the region B and the region C where the aluminum electrode 17 and the back-surface silver electrode 19 are partially overlapped, three metals of silicon in the p+ layer 14 of the silicon substrate, aluminum in the aluminum electrode 17, and silver in the back-surface silver electrode 19 are partially alloyed to form an alloyed area 23 as shown in FIGS. 1-4 and 1-5. While borders of the metals (the silicon, the aluminum, and the silver) in the region B and the region C are clearly defined in FIGS. 1-1 and 1-5, it is needless to say that the regions are partially alloyed and actually not clear.

In the solar cell according to the embodiment, as shown in FIGS. 1-3 and 1-4, the back-surface silver electrode 19 presents a substantially square (rectangular) shape in the in-plane direction of the silicon substrate. The corners of the substantially square (rectangular) back-surface silver electrode 19 are curved. Specifically, the back-surface silver electrode 19 is rounded off at the corners of the substantial square (rectangular) shape.

As a result of this, in the solar cell according to the embodiment, as shown in FIG. 1-5, the alloyed area 23 is reliably formed in the region B and the region C where the aluminum electrode 17 and the back-surface silver electrode 19 are partially overlapped, and also, the back-surface silver electrode 19 and the aluminum electrode 17 are reliably bonded even at the periphery of the back-surface silver electrode 19.

In a conventional solar cell, the back-surface silver electrode 19 is of a substantially square (rectangular) shape in the in-plane direction of the silicon substrate, and the angle of each corner of the substantial square (rectangular) shape is substantially 90 degrees. Similarly to the solar cell according to the embodiment, the conventional solar cell also includes a region B' and a region C', where the aluminum electrode 17 and the back-surface silver electrode 19 are partially overlapped, as shown in FIG. 2.

In such a solar cell, the overlapped area is very fragile due to stress assumedly caused by difference in rate of thermal expansion between materials that occurs during rapid heating and cooling in firing of production process. Therefore, after the firing, in the region B' and the region C' where the aluminum electrode 17 and the back-surface silver electrode 19 are partially overlapped, the back-surface silver electrode 19 can separate from the aluminum electrode 17 at the corners of the back-surface silver electrode 19. The stress tends to concentrate at sharp corners of the back-surface silver electrode 19. Namely, the alloyed area 23 is not properly formed at the sharp corners of the back-surface silver electrode 19, and the separation of the back-surface silver electrode 19 tends to start from the 90-degree corner thereof.

In the solar cell according to the embodiment, the corners are rounded off to remove sharp corners from the back-surface silver electrode 19 so that the stress does not concentrate on the corners of the back-surface silver electrode 19. By doing so, in the solar cell according to the embodiment, the stress concentrated on the corners of the back-surface silver electrode 19 is eased, and the alloyed area 23 is reliably formed in the region B and the region C where the aluminum electrode 17 and the back-surface silver electrode 19 are partially overlapped as shown in FIG. 1-5, which improves the bonding force between the aluminum electrode 17 and the back-surface silver electrode 19 and the substrate bonding force of the aluminum electrode 17 and the back-surface silver electrode 19. Therefore, according to the embodiment, a solar cell can be realized on which the back-surface silver electrode 19 is effectively prevented from separating from the aluminum electrode 17 by reliably bonding the back-surface silver electrode 19 and the aluminum electrode 17 even at the corners of the back-surface silver electrode 19.

When a round-off dimension R is larger than the dimension of the alloyed area 23, the alloyed area cannot be partially formed from the aluminum electrode 17 and the back-surface silver electrode 19, which is undesirable for the back-surface silver electrode 19. Therefore, as shown in FIG. 1-4, values of dimensions L1 and L3 of the overlapping area where the aluminum electrode 17 and the back-surface silver electrode 19 overlap in the longitudinal direction of the back-surface silver electrode 19 and dimensions L5 and L7 of the overlapping area where the aluminum electrode 17 and the back-surface silver electrode 19 overlap in the lateral direction of the back-surface silver electrode 19 that determine the dimension of the alloyed area 23 need to be determined so that the alloyed area 23 can be reliably formed. In addition, while the aluminum electrode 17 and the back-surface silver electrode 19 are formed by screen-printing as described later, the dimensions should be determined in consideration of misalignment in printing aluminum paste and silver paste.

When the thickness of the silicon substrate is reduced in the conventional solar cell to reduce the cost of the solar cell, the warpage of the silicon substrate caused by different rates of thermal shrinkage between silicon and aluminum is larger compared with a thicker silicon substrate. When the silicon substrate warps to a large extent, there is a problem that the silicon substrate cracks in the production process after the firing, resulting in a low production yield, or the production becomes impossible due to the crack in the silicon substrate.

Even in an effort of preventing the silicon substrate from warping by changing the material of the aluminum electrode to improve the rate of thermal shrinkage of the electrode material as a countermeasure to the problem, the back-surface silver electrode partially separates due to the different rates of thermal shrinkage between aluminum and silver depending on the materials combination. When the back-surface silver electrode separates to a large extent, there is also a problem that the solar cell cracks due to stacking of the solar cells or the characteristics of the solar cell deteriorate, and thus the production yield decreases.

However, in the solar cell according to the embodiment, as described above, it is possible to improve the bonding force between the aluminum electrode 17 and the back-surface silver electrode 19 and the bonding force of the aluminum electrode 17 and the back-surface silver electrode 19 with the silicon substrate, and thus the separation of the back-surface silver electrode 19 or the separation of the aluminum electrode 17 can be effectively prevented. This can ensure the bonding between the aluminum electrode 17 and the back-surface silver electrode 19 and the bonding of the aluminum electrode 17 and the back-surface silver electrode 19 with the substrate.

Therefore, the solar cell according to the embodiment does not cause many cracks on the silicon substrate differently from the conventional solar cell even when the thickness of the silicon substrate is reduced to lower the cost of the solar cell, and is applicable enough, whereby wider options and various types are available for the silver paste.

Furthermore, because the solar cell according to the embodiment has the back-surface silver electrode 19 rounded off at the sharp corners which exist in the back-surface silver electrode of the conventional solar cell, the area of the back-surface silver electrode 19 is smaller, and the amount of the silver paste used for the back-surface silver electrode 19 is reduced. Therefore, according to the embodiment, material costs can be reduced, and thus an inexpensive solar cell can be realized. Specific effects of the reduction of the silver paste will be described later.

Next, a method for producing the solar cell according to the embodiment configured as above is explained. To produce the solar cell according to the embodiment, as shown in FIG. 3-1, a p-type silicon substrate 11' is sliced out of, for example, a p-type monocrystalline silicon ingot produced by the pulling method or a polycrystalline silicon ingot produced by the casting method. The silicon substrate 11' is etched by a thickness of about 10 to 20 micrometers using, for example, a few to 20 wt/% of sodium hydroxide or sodium carbonate, and a damaged layer and contamination produced on the silicon surface during slicing are removed.

Further, depending on necessity, the silicon substrate 11 is washed using a mixed solution of hydrochloric acid and hydrogen peroxide to remove heavy metals such as iron attached on the surface of the substrate. An anisotropic etching is then performed using a solution made by adding isopropyl alcohol (IPA) to a similar low-concentrated alkaline solution to form a texture so that, for example, the surface of silicon (111) is exposed.

Next, an n-type diffused layer 13a is formed to form a p-n junction. In the process of forming the n-type diffused layer 13a, for example, phosphorus oxychloride ($POCl_3$) is used; a diffusion process is performed in a mixture gas atmosphere of nitrogen and oxygen at 800 to 900 degrees Celsius, and phosphorus is thermally diffused as shown in FIG. 3-2 to form the n-type diffused layer 13a with the inverse conductivity type all over the surface of the silicon substrate 11'. The sheet resistance of the n-type diffused layer 13a is, for example, several tens of (30 to 80) ohm/square, and the depth of the n-type diffused layer 13a is, for example, about 0.3 to 0.5 micrometer.

To protect the n-type diffused layer 13a on the light receiving surface, polymer resistive paste is printed by screen printing and dried to form resist. The n-type diffused layer 13a formed on the back and side of the silicon substrate 11' is removed by soaking the silicon substrate 11' in a solution of, for example, 20 wt/% potassium hydroxide for a few minutes. The resist is then removed by an organic solvent to obtain the silicon substrate 11' with the n-type diffused layer 13 formed all over the surface (light receiving surface) thereof as shown in FIG. 3-3.

Figures 1, 2, 3, 4:
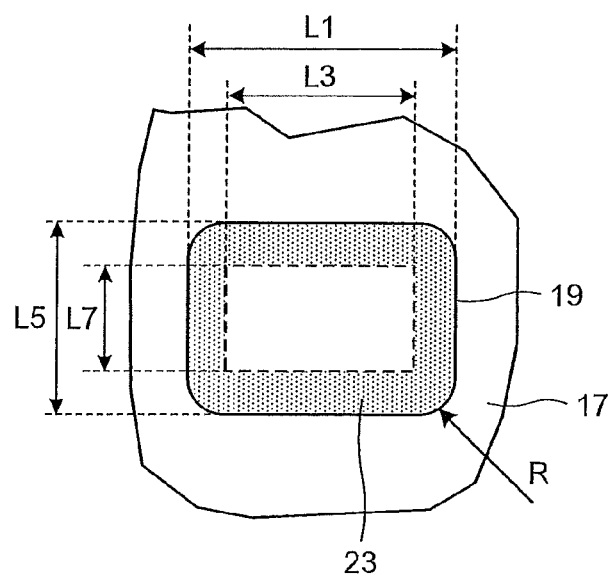

As shown in FIG. 3-4, the antireflective coating 15 made of a silicon oxide film, a silicon nitride film, or titanium oxide film is formed on the n-type diffused layer 13 in a uniform thickness. In the case of the silicon oxide film, for example, the antireflective coating 15 is formed by plasma CVD using silane ($SiH_4$) gas and ammonia ($NH_3$) gas as raw materials at a heating temperature equal to or higher than 300 degrees Celsius under reduced pressure. For example, the refractive index is about 2.0 to 2.2, and the optimal thickness of the antireflective coating 15 is about 70 to 90 nanometers.

Figures 1, 2, 3, 4, 5:
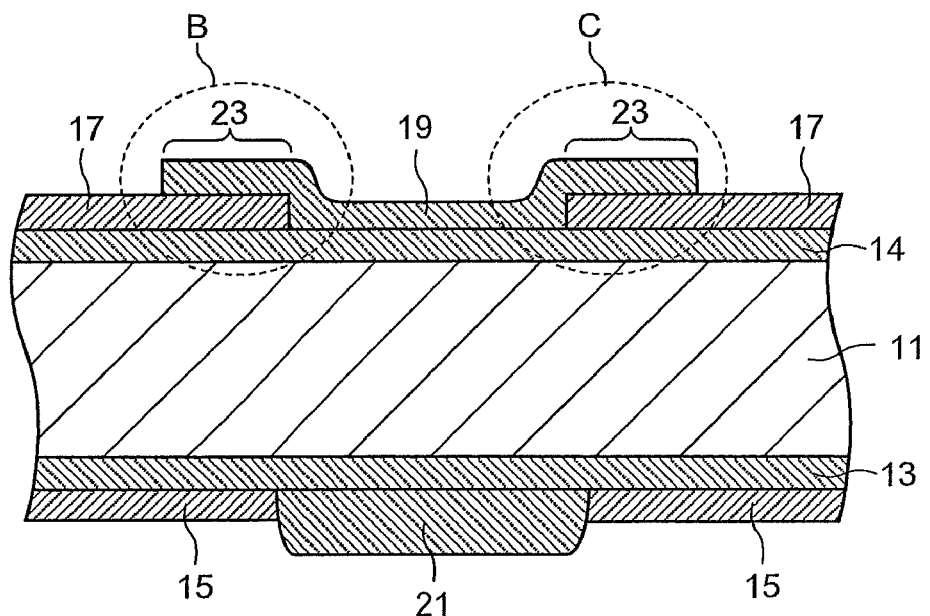
Figure 2:
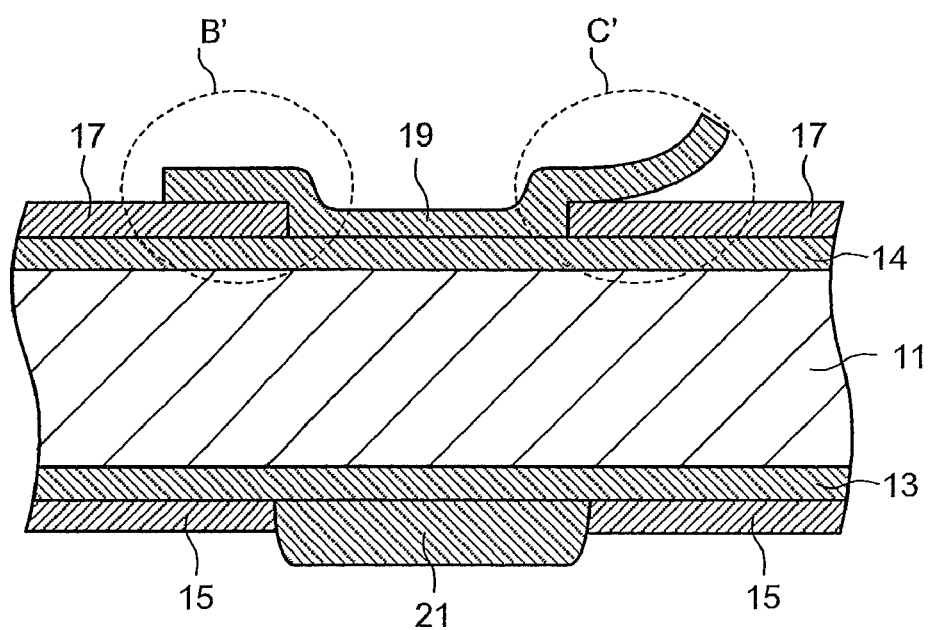

Next, the aluminum paste including glass is printed all over the back surface (the surface opposite to the light receiving surface) of the silicon substrate 11' using screen printing and dried as shown in FIG. 3-5 so that an aluminum paste layer 17a is formed all over the back surface of the silicon substrate 11'. The aluminum paste layer 17a has openings corresponding to the locations where the back-surface silver electrodes 19 are formed. The thickness of the applied aluminum paste can be adjusted according to the wire diameter that forms a screen mask, the thickness of emulsion, and the like.

Subsequently, using screen printing, the silver paste for the back-surface silver electrodes 19 is printed on the back surface (the surface opposite to the light receiving surface) of the silicon substrate 11' on which the aluminum electrode 17 is formed, and dried as shown in FIG. 3-6 so that a silver paste layer 19a is formed. At this point, the form of the silver paste layer 19a is a substantial square (rectangle) with the corners rounded off as shown in FIG. 1-3. Here, the silver paste can be printed using a screen mask with a pattern formed by an emulsion 27 on a mesh 25 extended on a mask frame 29 as shown in FIG. 3-7 and FIG. 3-8.

Further, using screen printing, the silver paste for the front-surface silver electrode 21 is printed on the front surface (the light receiving surface) of the silicon substrate 11' on which the antireflective coating 15 is formed, and dried so that a silver paste layer 21a is formed as shown in FIG. 3-9. The thickness of the applied silver paste can also be adjusted according to the wire diameter of the mesh that forms a screen mask, the thickness of emulsion, and the like.

Next, in the firing process for forming the electrode, the paste layers for the front and back electrodes are fired at the same time at 600 to 900 degrees Celsius for a few to a dozen minutes. On the front surface (the light receiving surface) of the silicon substrate 11', the silver paste layer is fired to become the front-surface silver electrode 21 as shown in FIG. 3-10; at the same time, the silver material contacts the silicon in the silicon substrate 11' through the glass material included in the silver paste while the antireflective coating 15 is melting, and the antireflective coating 15 is solidified again. This secures the conductivity between the front-surface silver electrode 21 and the silicon. The process is generally called a fire-through process.

On the other hand, on the back surface (the surface opposite to the light receiving surface) of the silicon substrate 11', the aluminum paste layer is fired to become the aluminum electrode 17 as shown in FIG. 3-10, and the silver paste layer is burned to become the back-surface silver electrode 19 as shown in FIG. 3-10. Here, the aluminum in the aluminum paste reacts with the silicon in the silicon substrate 11' so that the p+ layer 14 is formed immediately below the aluminum electrode 17. The layer is generally called a back-surface field (BSF) layer, which contributes to the improvement of the energy conversion efficiency of the solar battery. In the silicon substrate 11', an area between the n-type diffused layer 13 and the p+ layer 14 is made into the p-type layer 11.

The silver paste reacts directly with the silicon in the silicon substrate 11' where the silver paste directly contacts the silicon substrate 11', and three metals including the silicon in the silicon substrate 11', the aluminum in the aluminum paste (the aluminum electrode 17), and the silver in the back-surface silver electrode 19 are partially alloyed where the silver paste contacts the aluminum paste. After the process described above, the cell is completed based on the method for producing the solar cell. In a module manufacturing process after the cell fabrication, a copper lead tab is provided on the back-surface silver electrode 19 to extract output power to the outside.

The solar cell described above can be realized by changing only the shape of the back-surface silver electrode, that is, can be realized by changing only the shape of the mask to screen-print the silver paste for the back-surface silver electrode without changing existing equipment.

Next, reduced area of the back-surface silver electrode and reduced amount of the silver paste are explained with a specific example. As shown in FIG. 4-1 and FIG. 4-2, the explanation is given of a case of configuring the solar cell including adjacent back-surface silver electrodes 19 arranged in two rows in the longitudinal direction under the following conditions.

Length L1 of the long side of the back-surface silver electrode 19=9.8 millimeters Length L5 of the short side of the back-surface silver electrode 19=7.8 millimeters Distance L9 between back-surface silver electrode arrays=75 millimeters Distance L11 between the back-surface silver electrodes 19 at both ends of the back-surface silver electrode array=135 millimeters Distance L13 between the adjacent back-surface silver electrodes 19 in the back-surface silver electrode array=22.5 millimeters Table 1 shows the reduced area of the back-surface silver electrode 19 and the reduction rate of the silver paste when the curvature radius R of the portion rounded off of the back-surface silver electrode 19 is changed from 1.0 millimeters to 3.0 millimeters in increments of 0.5 millimeters in the solar cell with the dimensions as described above.

TABLE 1

| R (mm) | Reduced area of back-surface silver electrode (mm$^2$) | Reduction rate of silver paste (%) |
| --- | --- | --- |
| 3.0 | 7.7 | 10.1 |
| 2.5 | 5.4 | 7.0 |
| 2.0 | 3.4 | 4.5 |
| 1.5 | 1.9 | 2.5 |
| 1.0 | 0.9 | 1.1 |

As shown in table 1, with the curvature radius R of the portion rounded off of the back-surface silver electrode 19 increased from 1.0 millimeters to 3.0 millimeters, the reduced area of the back-surface silver electrode 19 increases from 0.9 square millimeters to 7.7 square millimeters. The reduction rate of the silver paste, namely the effect on reduction in the silver paste, is increased from 1.1% to 10.1%. This proves that the embodiment of the present invention can reduce the amount of the silver paste for the back-surface silver electrode 19. Thereby, the cost of the materials can be reduced in the solar cell according to the embodiment, and an inexpensive solar cell can be realized.

Second Embodiment

A solar cell according to another embodiment of the present invention is explained in the chapter of a second embodiment. The solar cell according to the second embodiment is configured basically in the same manner as the solar cell according to the first embodiment. Therefore, what are different between the solar cell according to the first embodiment and the solar cell according to the second embodiment are explained below. In the drawings referenced below, the components identical to those in the solar cell according to the first embodiment are denoted with the same reference numerals.

FIGS. 5-1 to 5-3 are schematics for explaining a general configuration of the solar cell according to the second embodiment. FIG. 5-1 corresponds to FIG. 1-3, and is a plan view of the general configuration of the back surface (a surface opposite to the light receiving surface) of the solar cell according to the second embodiment. FIG. 5-2 corresponds to FIG. 1-4, and is an enlarged schematic of the surrounding area of a back-surface silver electrode 31 shown in FIG. 5-1, depicting the area where the aluminum electrode 17 provided on the back-surface of the solar cell and the back-surface silver electrode 31 are partially overlapped.

FIG. 5-3 corresponds to FIG. 1-5, and is an enlargement of the surrounding area of the back-surface silver electrode 31, depicting the cross section of the surrounding area of a region D and a region E, where the aluminum electrode 17 provided on the back surface of the solar cell and the back-surface silver electrode 31 are partially overlapped. Because the cross section and the light receiving surface (front surface) of the solar cell are configured identically to those in the first embodiment, FIGS. 1-1 and 1-2 are referenced here.

The back-surface silver electrode 31 according to the second embodiment corresponds to the back-surface silver electrode 19 according to the first embodiment; however, as shown in FIGS. 5-1 and 5-2, the back-surface silver electrode 31 is different in that the corners are chamfered instead of being rounded off.

On the solar cell according to the second embodiment, the back-surface silver electrode 31 presents a substantially square (rectangular) shape in the in-plane direction of the silicon substrate. The back-surface silver electrode 31 is chamfered at the corners of the substantially square (rectangular) shape.

Although the shape of the corners of the back-surface silver electrode is different from that in the first embodiment, in the region D and the region E where the aluminum electrode 17 and the back-surface silver electrode 31 are partially overlapped, three metals of silicon in the p+ layer 14 of the silicon substrate, aluminum in the aluminum electrode 17, and silver in the back-surface silver electrode 31 are partially alloyed so that an alloyed area 33 is formed as shown in FIGS. 5-2 and 5-3. While borders of the metals (the silicon, the aluminum, and the silver) in the region D and the region E are clearly defined in FIG. 5-3, it is needless to say that the regions are partially alloyed and actually not clear.

This ensures that, on the solar cell according to the embodiment, the alloyed area 33 is reliably formed in the region D and the region E where the aluminum electrode 17 and the back-surface silver electrode 31 are partially overlapped as shown in FIG. 5-3, and the back-surface silver electrode 31 and the aluminum electrode 17 are reliably bonded at the edges of the back-surface silver electrode 31.

With the solar cell according to the embodiment, the corners of the back-surface silver electrode 31 are chamfered to remove any sharp edges so that a stress is not concentrated on the corners of the back-surface silver electrode 31. This can relieve the stress concentrated at the corners of the back-surface silver electrode 31, ensures that the alloyed area 33 is formed in the region D and the region E where the aluminum electrode 17 and the back-surface silver electrode 31 are partially overlapped as shown in FIG. 5-3, and thus increases the bonding force between the aluminum electrode 17 and the back-surface silver electrode 31 and the substrate bonding force of the aluminum electrode 17 and the back-surface silver electrode 31. Therefore, according to the embodiment, a solar cell can be realized that reliably bonds the back-surface silver electrode 31 and the aluminum electrode 17 at the corners of the back-surface silver electrode 31 to effectively prevent the separation of the back-surface silver electrode 31 from the aluminum electrode 17.

When a chamfered dimension C is larger than the alloyed area 33, a part of the alloyed area of the aluminum electrode 17 and the back-surface silver electrode 31 cannot be formed. Such an electrode is not suitable as the back-surface silver electrode 31. As shown in FIG. 5-2, dimensions L21 and L23 where the aluminum electrode 17 and the back-surface silver electrode 31 are overlapped in the longitudinal direction of the back-surface silver electrode 31 and dimensions L25 and L27 where the aluminum electrode 17 and the back-surface silver electrode 31 are overlapped in the short-side direction of the back-surface silver electrode 31 that determine the dimension of the alloyed area 33 need to be determined so as to reliably form the alloyed area 33. Additionally, because the aluminum electrode 17 and the back-surface silver electrode 31 are formed by screen printing as described later, the dimensions should be determined with consideration of the pattern misalignment of the aluminum paste and the silver paste at the time of screen printing.

The solar cell according to the embodiment can also ensure the bonding between the aluminum electrode 17 and the back-surface silver electrode 31 and the bonding between the substrate and the aluminum electrode 17 as well as the back-surface silver electrode 31 as described above. Therefore, in the solar cell according to the embodiment, even when the thickness of the silicon substrate is reduced to lower the cost the solar cell, the silicon substrate will not have many cracks differently from the conventional solar cell, and wider options and various types are available for the silver paste.

Furthermore, because the solar cell according to the embodiment has the sharp corners of the back-surface silver electrode 31 chamfered, the area of the back-surface silver electrode 31 is smaller, which reduces the amount of the silver paste used for the back-surface silver electrode 31 compared to the conventional solar cell where such sharp corners exist in the back-surface silver electrode. As a result, according to the second embodiment, it is also possible to reduce material costs, and thus realize an inexpensive solar cell.

The solar cell according to the embodiment can be produced in the same process as in the first embodiment except that the silver paste is screen-printed in the substantially square (rectangular) shape with chamfered corners as shown in FIG. 5-1. The solar cell according to the embodiment also can be realized by changing the shape of the back-surface silver electrode, namely by changing only the shape of the mask for screen-printing the back-surface silver electrode with the silver paste without modifying the existing facilities.

Figures 1, 3:
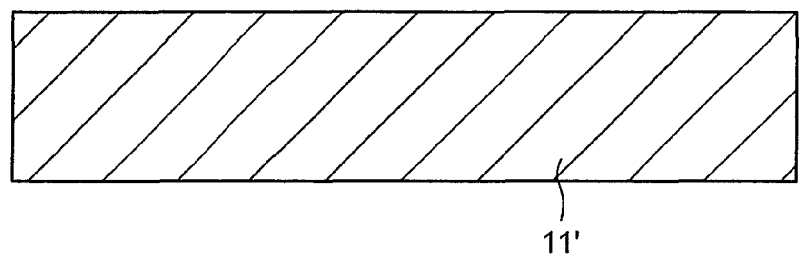
Figures 2, 3:
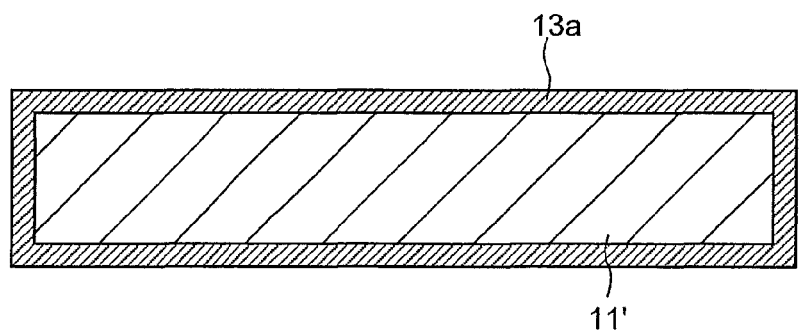
Figure 3:
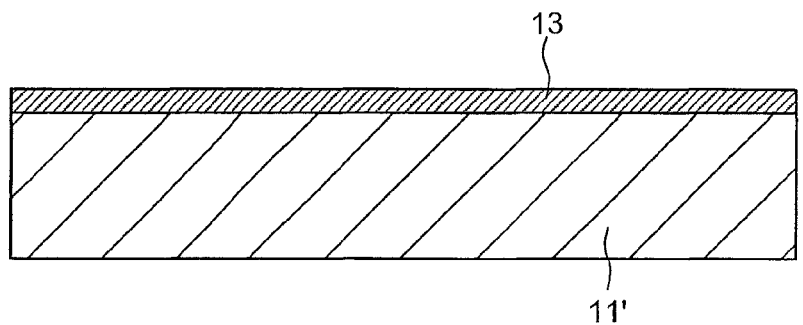
Figures 3, 4:
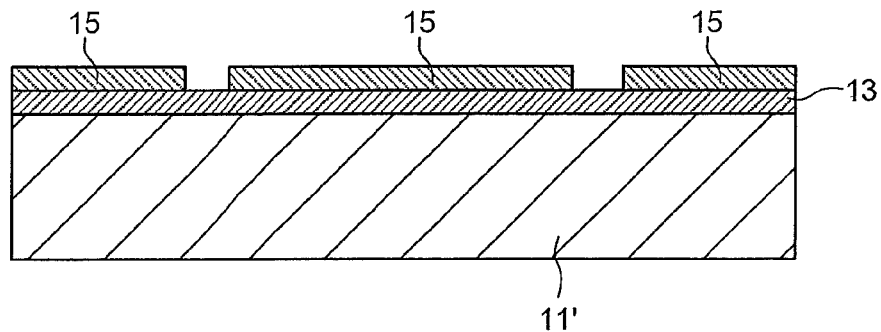
Figures 3, 4, 5:
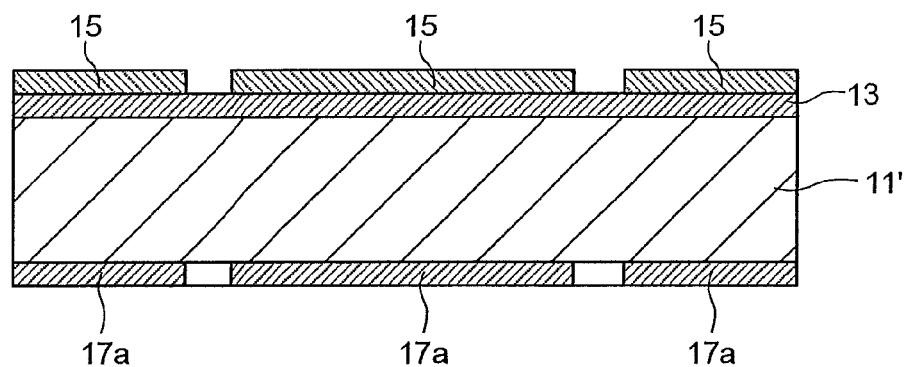
Figures 3, 4, 5, 6:
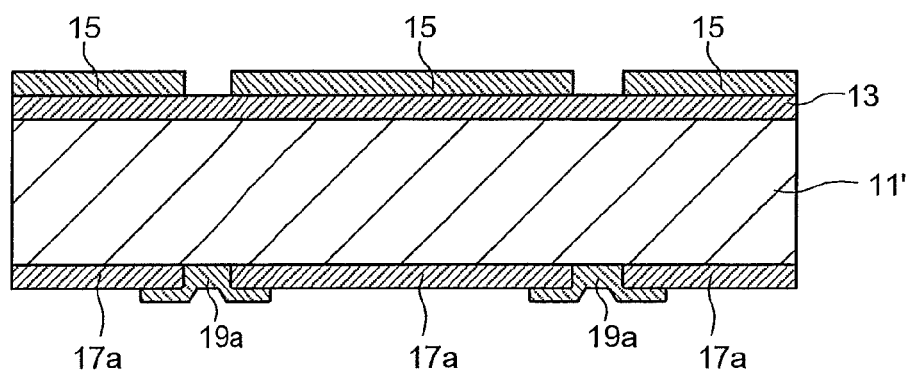
Figures 3, 4, 5, 6, 7:
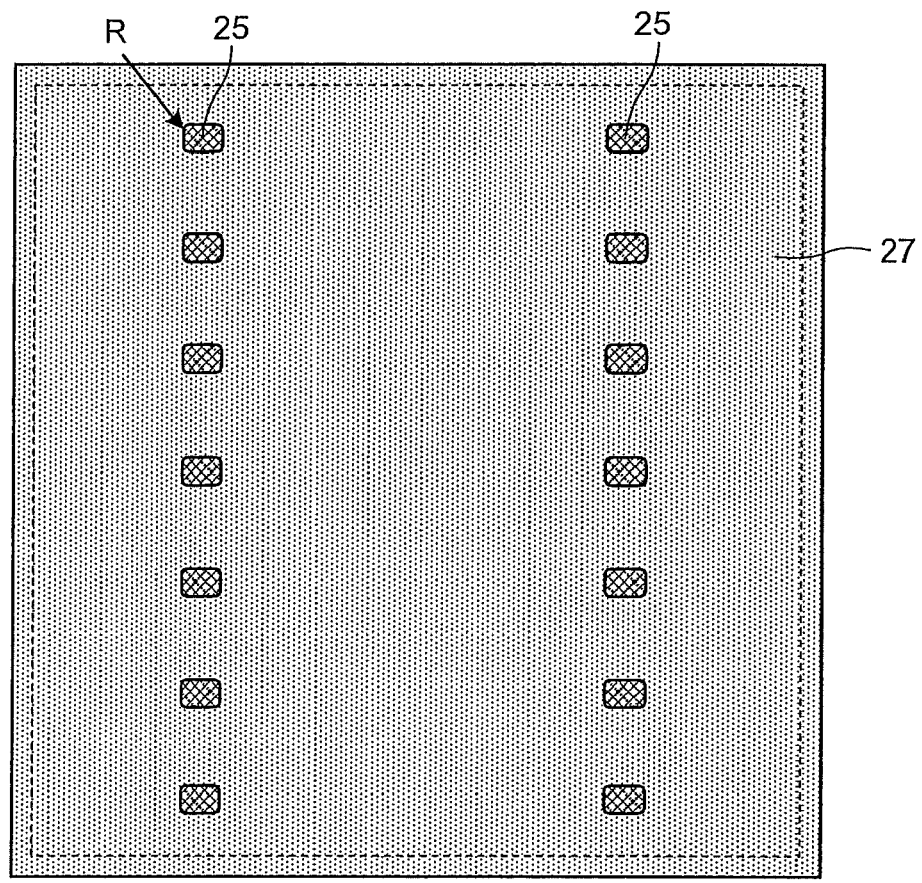
Figures 3, 4, 5, 6, 7, 8:
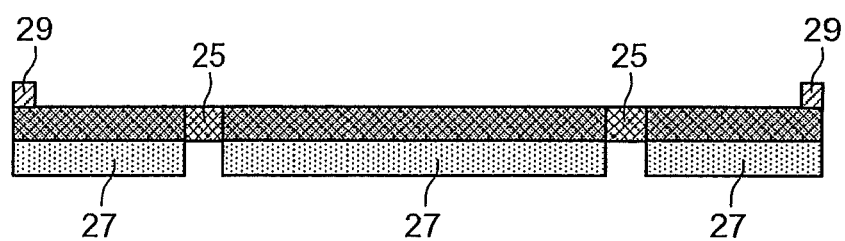
Figures 3, 4, 5, 6, 7, 8, 9:
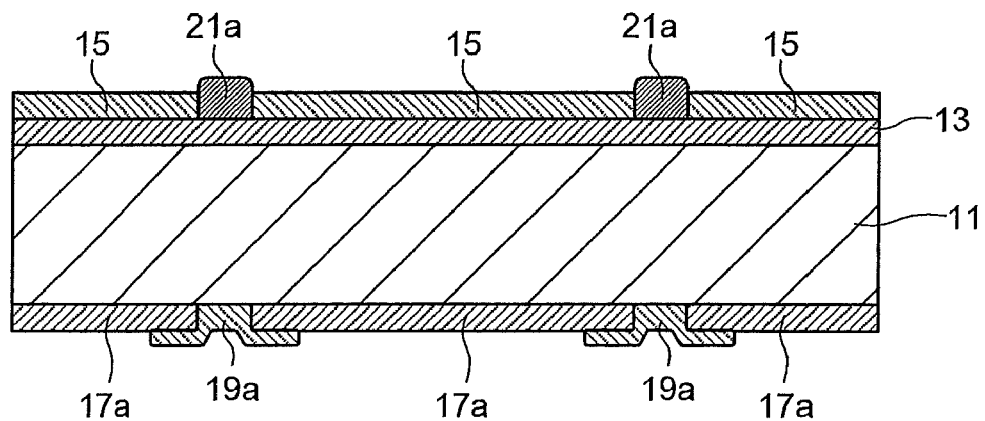
Figures 3, 4, 5, 6, 7, 8, 9, 10:
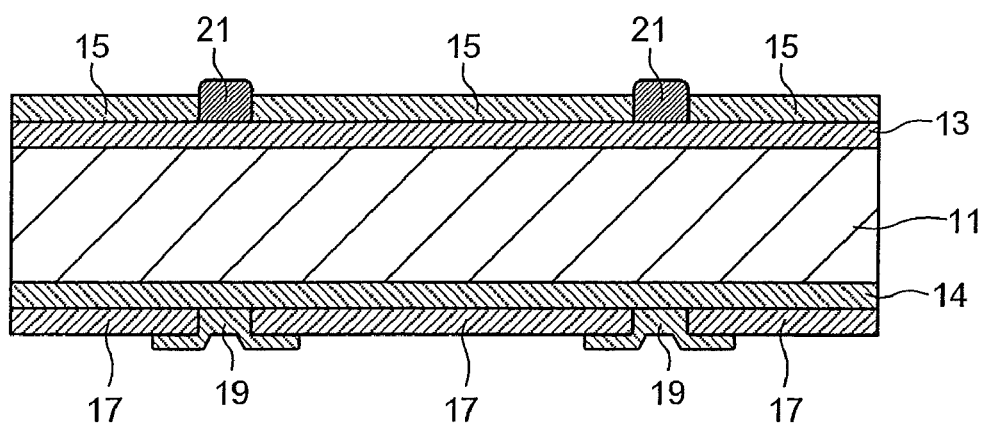
Figures 2, 4:
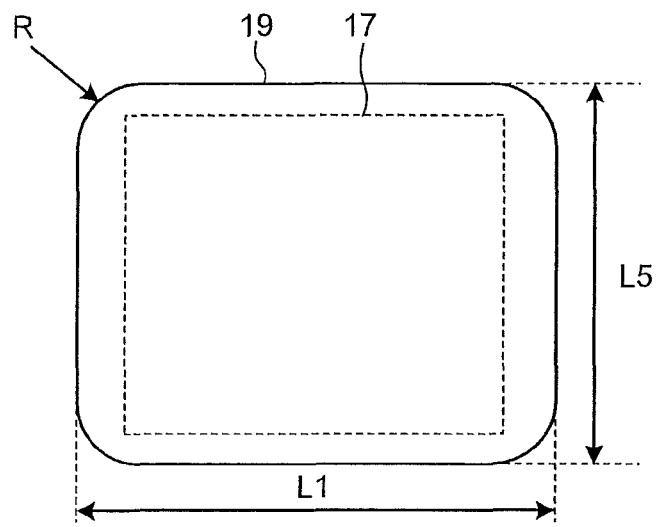
Figures 1, 5:
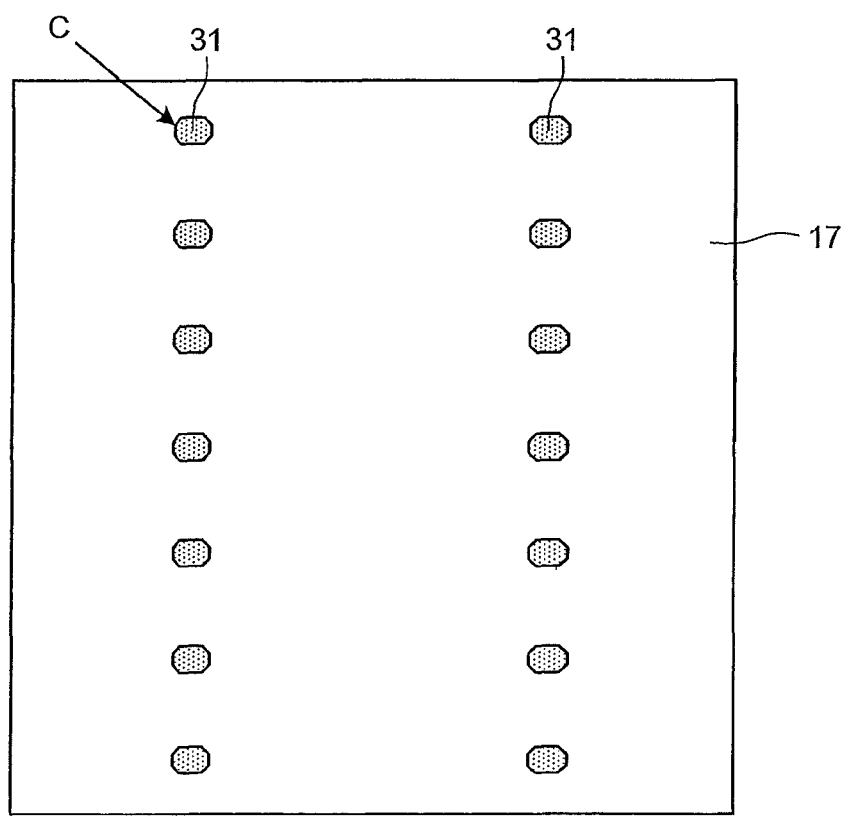
Figures 2, 5:
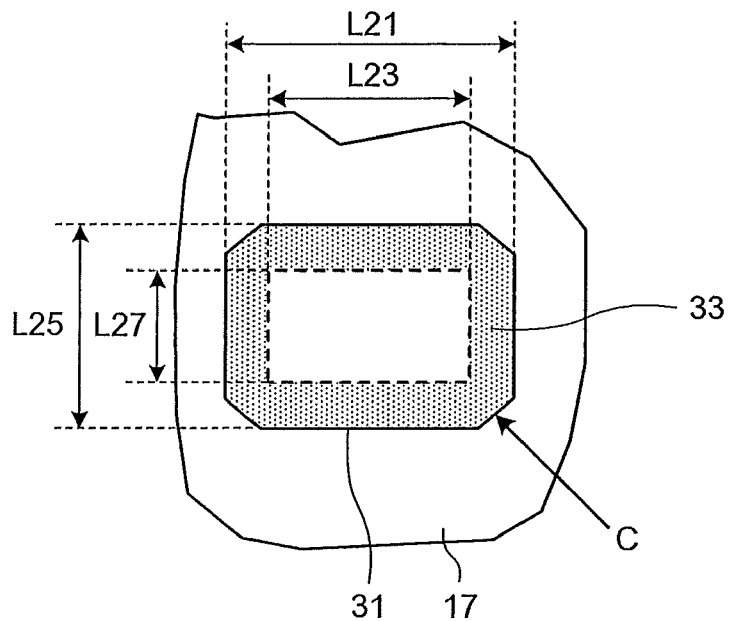
Figures 3, 5:
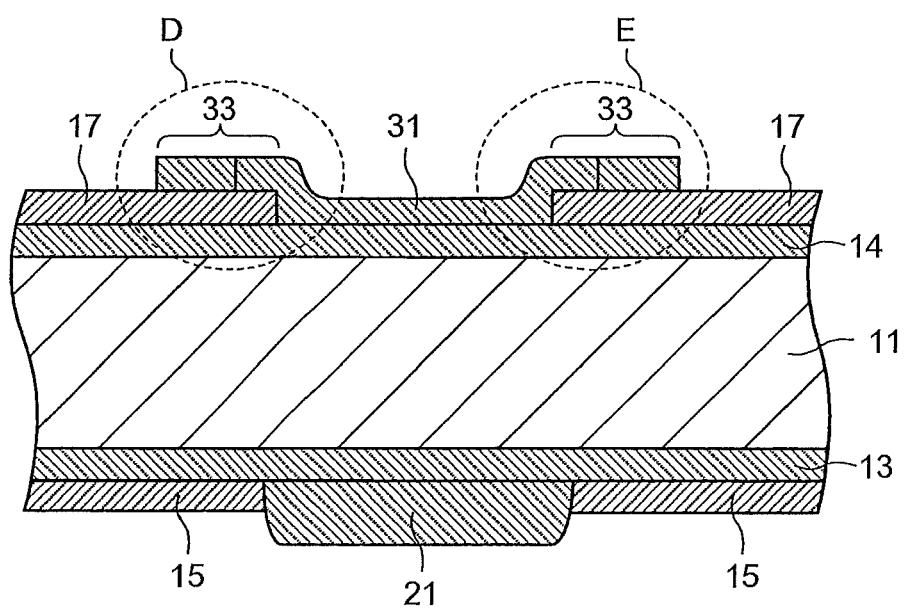
Figures 1, 6:
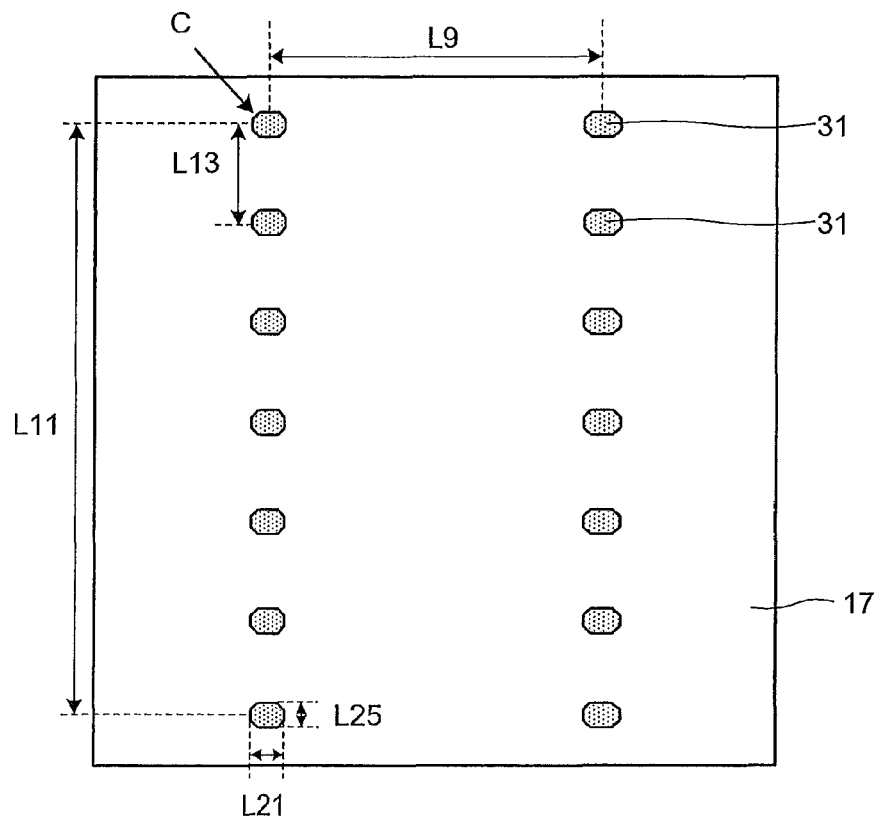
Figures 2, 6:
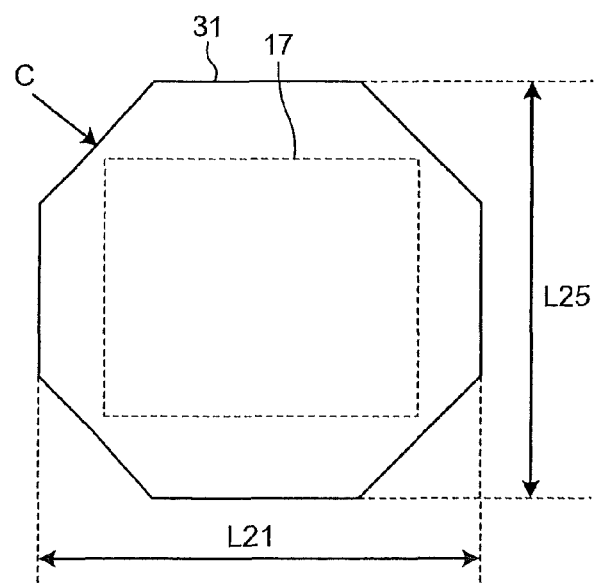

Next, reduced area of the back-surface silver electrode and reduced amount of the silver paste are explained with a specific example. As shown in FIGS. 6-1 and 6-2, the explanation is given of a case of configuring the solar cell including adjacent back-surface silver electrodes 31 arranged in two rows in the longitudinal direction under the following conditions.

Length L21 of the long side of the back-surface silver electrode 31=9.8 millimeters Length L25 of the short side of the back-surface silver electrode 31=7.8 millimeters Distance L9 between back-surface silver electrode arrays=75 millimeters Distance L11 between the back-surface silver electrodes 31 at both ends of the back-surface silver electrode array=135 millimeters Distance L13 between the adjacent back-surface silver electrodes 31 in the back-surface silver electrode array=22.5 millimeters Table 2 depicts the reduced area of the back-surface silver electrode 31 and the reduction rate of the silver paste when the chamfered dimension C of the chamfered portion of the back-surface silver electrode 31 is changed from 1.0 millimeters to 3.0 millimeters in increments of 0.5 millimeters in the solar cell with the dimensions as described above.

TABLE 2

| c (mm) | Reduced area of back-surface silver electrode (mm$^2$) | Reduction rate of silver paste (%) |
| --- | --- | --- |
| 3.0 | 18.0 | 23.5 |
| 2.5 | 12.5 | 16.4 |
| 2.0 | 8.0 | 10.5 |
| 1.5 | 4.5 | 5.9 |
| 1.0 | 2.0 | 2.6 |

As shown in table 2, with the chamfered dimension C of the portion chamfered off of the back-surface silver electrode 31 increased from 1.0 millimeters to 3.0 millimeters, the reduced area of the back-surface silver electrode 31 increases from 2.0 square millimeters to 18.0 square millimeters. The reduction rate of the silver paste, namely the effect on reduction in the silver paste, is increased from 2.6% to 23.5%. This proves that the embodiment of the present invention can reduce the amount of the silver paste for the back-surface silver electrode 31. Thereby, the cost of the material can be reduced in the solar cell according to the embodiment, and an inexpensive solar cell can be realized.

In either case of the first embodiment and the second embodiment, the curvature radius or the chamfered dimension needs to be large to reduce more amount of the silver paste; however, too large curvature radius or chamfered dimension prevents forming the alloyed area of aluminum and silver. To determine the actual value of the curvature radius or the chamfered dimension, pattern misalignment that occurs on screen-printing the pastes for the aluminum electrode and the silver electrode should be considered so that the alloyed area is formed reliably.

The solar cells according to the first embodiment and the second embodiment are examples of the present invention. The present invention is not limited by the embodiments, but is susceptible to various changes and modifications without departing from the scope of the present invention.

INDUSTRIAL APPLICABILITY

As described above, the solar cell according to the present invention is useful as a solar cell configured with an aluminum electrode and a silver electrode for extracting electric power partially overlapped with each other.

The invention claimed is:

1. A solar cell comprising:
    a photoelectric conversion layer including a first surface and a second surface;
    a first electrode on the first surface;
    a second electrode on the second surface and made from a first metal paste;
    and;
    a third electrode on the second surface and made from a second metal paste, different from the first metal paste, the third electrode including an overlapping portion that overlaps the second electrode in a plane substantially parallel to the photoelectric conversion layer, and
    the third electrode having rounded corners in a plan view orthogonal to said plane, wherein an integrated region, where the first metal paste and the second metal paste are at least partially melted and solidified, is located throughout the entire area of the overlapping portion.

2. A solar cell according to claim 1, wherein the first metal paste is aluminum paste, and the second metal paste is silver paste.

3. A solar cell, comprising:
    a photoelectric conversion layer having a first surface and a second surface;
    a first electrode on the first surface;
    a second electrode on the second surface and made from a first metal paste; and
    a third electrode on the second surface and made from a second metal paste, different from the first metal paste, the third electrode including an overlapping portion that overlaps the second electrode in a plane substantially parallel to the photoelectric conversion layer, and
    the third electrode having chamfered corners in a plan view orthogonal to said plane, wherein an integrated region, where the first metal paste and the second metal paste are at least partially melted and solidified, is located throughout the entire area of the overlapping portion.

4. The solar cell according to claim 3, wherein the first metal paste is aluminum paste, and the second metal paste is silver paste.

* * * * *